(12) United States Patent
Jeong et al.

(10) Patent No.: US 12,557,427 B2
(45) Date of Patent: Feb. 17, 2026

(54) CARRIER-SELECTIVE CONTACT JUNCTION SILICON SOLAR CELL AND MANUFACTURING METHOD THEREFOR

(71) Applicant: KOREA INSTITUTE OF INDUSTRIAL TECHNOLOGY, Cheonan-si (KR)

(72) Inventors: Chae Hwan Jeong, Gwangju (KR); Ki Seok Jeon, Gwangju (KR)

(73) Assignee: KOREA INSTITUTE OF INDUSTRIAL TECHNOLOGY, Cheonan-si (KR)

( * ) Notice: Subject to any disclaimer, the term of this patent is extended or adjusted under 35 U.S.C. 154(b) by 447 days.

(21) Appl. No.: 18/327,071

(22) Filed: Jun. 1, 2023

(65) Prior Publication Data

US 2023/0307569 A1    Sep. 28, 2023

Related U.S. Application Data

(63) Continuation of application No. 17/289,730, filed as application No. PCT/KR2019/009026 on Jul. 22, 2019, now abandoned.

(30) Foreign Application Priority Data

Oct. 31, 2018 (KR) ........................ 10-2018-0131641

(51) Int. Cl.
*H10F 71/00* (2025.01)
*H10F 10/164* (2025.01)
(Continued)

(52) U.S. Cl.
CPC ......... *H10F 71/129* (2025.01); *H10F 10/164* (2025.01); *H10F 19/30* (2025.01);
(Continued)

(58) Field of Classification Search
CPC .............................. H10F 10/164; H10F 77/211
See application file for complete search history.

(56) References Cited

U.S. PATENT DOCUMENTS

2007/0264488 A1    11/2007  Lee

FOREIGN PATENT DOCUMENTS

JP      2012-234847 A    11/2012
JP      2018-76220 A     5/2018
(Continued)

OTHER PUBLICATIONS

International Search Report mailed Nov. 26, 2019 for PCT/KR2019/009026, citing the above reference(s).

*Primary Examiner* — Matthew L Reames
(74) *Attorney, Agent, or Firm* — CANTOR COLBURN LLP

(57) ABSTRACT

A method of manufacturing a carrier-selective contact junction silicon solar cell includes: preparing a conductive silicon substrate; forming a first passivation layer and a second passivation layer on and under the conductive silicon substrate, respectively; forming an electron-selective contact layer under the second passivation layer; forming a hole-selective contact layer on the first passivation layer; forming an upper transparent electrode on the hole-selective contact layer; forming an upper metal electrode on the upper transparent electrode; and forming a lower metal electrode under the electron-selective contact layer. In forming the hole-selective contact layer, a sandwich-structured multi-layer film is formed by depositing a copper iodide thin film on a top surface and a bottom surface of an iodine thin film, and a single-film copper iodide thin film is formed by low-temperature annealing the sandwich-structured multi-layer film.

4 Claims, 6 Drawing Sheets

(51) Int. Cl.
  *H10F 19/30*  (2025.01)
  *H10F 77/166*  (2025.01)
  *H10F 77/20*  (2025.01)

(52) U.S. Cl.
  CPC ......... *H10F 77/166* (2025.01); *H10F 77/211* (2025.01); *H10F 77/244* (2025.01)

(56) References Cited

FOREIGN PATENT DOCUMENTS

| KR | 10-2014-0007045 | A  | 1/2014 |
| KR | 10-2017-0070855 | A  | 6/2017 |
| KR | 10-1837643      | B1 | 3/2018 |
| KR | 10-1847614      | B1 | 5/2018 |

FIG. 4

Atomic percent(%)

|  | As-dep. | 190 °C |
|---|---|---|
| O1s | 4.76 | 44.96 |
| Cu2p1 | 0 | 0 |
| Cu2p3 | 50.28 | 44.96 |
| I3d3 | 0 | 0 |
| I3d5 | 44.96 | 44.96 |

CARRIER-SELECTIVE CONTACT JUNCTION SILICON SOLAR CELL AND MANUFACTURING METHOD THEREFOR

This application is a divisional of U.S. patent application Ser. No. 17/289,730, filed on Apr. 29, 2021, which is a national stage application of PCT/KR2019/009026, filed on Jul. 22, 2019, which claims priority to Korean Patent Application No. 10-2018-0131641 filed on Oct. 31, 2018, and all the benefits accruing therefrom under 35 U.S.C. § 119, § 120 and § 371, the contents of which in their entirety are herein incorporated by reference.

TECHNICAL FIELD

The present invention relates to a carrier-selective contact junction silicon solar cell using a copper iodide thin film as a carrier-selective contact layer and a method of manufacturing the same.

BACKGROUND ART

Generally, solar cells have a structure in which a p-type silicon thin film (p-type semiconductor layer) is formed on an n-type silicon substrate, and in this case, the p-type silicon thin film is formed by doping p-type impurities therein. Thus, a lower-layer portion of the silicon substrate remains as an n-type semiconductor layer, and an upper-layer portion thereof forms a p-type semiconductor layer, thereby forming a pn junction portion. In addition, a metal electrode for collecting holes and electrons photo-generated due to the pn junction portion is formed on front and rear surfaces of the silicon substrate.

It is important for solar cells to maximize photoelectric conversion efficiency by improving passivation properties of a surface of a silicon substrate and reducing a recombination rate of carriers such as electrons or holes.

Carrier-selective contact (CSC) solar cells have a structure capable of selectively collecting carriers by controlling the movement of one of electrons or holes by adjusting a barrier height in an energy band or through blocking or tunneling. The CSC utilizes a heterojunction technology to minimize recombination of carriers in metal contact and transfer the carriers effectively.

As an example of a silicon solar cell using a heterojunction technology, Japanese Laid-Open Patent Publication No. 2012-234847 (published on Nov. 29, 2012) discloses a technology of forming a carbon-based thin film on a silicon-based semiconductor layer and forming a conductive oxide layer thereon to improve photoelectric conversion efficiency.

A CSC is classified as an electron-selective contact (ESC), which is a selective contact for electrons, a hole-selective contact (HSC), which is a selective contact for holes, and an electron and hole selective contact (EHSC), which is a selective contact for both electrons and holes.

Boron needs to be doped to form a p-type semiconductor layer during the manufacture of solar cells, but a boron doping process has a problem in that a process cost is high.

Recently, research and development to replace boron doping, which is performed to form a p-type semiconductor layer, by using a transition metal oxide (TMO) as a hole-selective contact (HSC) layer is being conducted. For example, research on a $MoO_x$/Si solar cell having $MoO_x$ deposited on an n-type silicon substrate is in progress, but conversion efficiency is low due to poor surface passivation properties of $MoO_x$, and thus efforts to improve the conversion efficiency are continuous.

(Prior art document) Japanese Patent Laid-Open Publication No. 2012-234847

DISCLOSURE

Technical Problem

The present invention is directed to providing a carrier-selective contact junction silicon solar cell capable of improving photoelectric conversion efficiency by forming a copper iodide thin film using a low-temperature annealing process to maintain excellent p-type semiconductor properties, and a method of manufacturing the same.

The present invention is also directed to providing a carrier-selective contact junction silicon solar cell capable of easily controlling a composition ratio of an iodine source according to a thickness of an iodine thin film that is interposed between copper iodide thin films as a sandwich structure, and a method of manufacturing the same.

Technical Solution

One aspect of the present invention provides a carrier-selective contact junction silicon solar cell including a conductive silicon substrate, a first passivation layer and a second passivation layer positioned on a top surface and a bottom surface of the conductive silicon substrate, respectively, a hole-selective contact layer formed on a top surface of the first passivation layer, an upper transparent electrode formed on a top surface of the hole-selective contact layer, an upper metal electrode formed on an upper portion of the upper transparent electrode, an electron-selective contact layer formed on a bottom surface of the second passivation layer, and a lower metal electrode formed on a bottom surface of the electron-selective contact layer, wherein, in order to selectively move a hole, the hole-selective contact layer is a single-film copper iodide thin film formed by low-temperature annealing a sandwich-structured multilayer film having copper iodide thin films layered on a top surface and a bottom surface of an iodine thin film.

Each of the copper iodide thin films of the sandwich-structured multilayer film may be formed to have a thickness of 5 to 15 nm.

The iodine thin film of the sandwich-structured multilayer film may be formed to have a thickness of 1 to 10 nm.

The single-film copper iodide thin film may be formed to have a thickness of 20 nm.

The single-film copper iodide thin film may have a composition ratio of Cu:I=1:1.

A process atmosphere temperature of the low-temperature annealing may range from 100 to 200° C.

Each of the first and second passivation layers may include an intrinsic amorphous silicon thin film (a-Si:H) in order to suppress electron-hole recombination.

The hole-selective contact layer may be formed of a material having a work function ($\Phi$>5.0 eV) higher than a work function of the conductive silicon substrate, and the electron-selective contact layer may be formed of a material having a work function ($\Phi$<3.8 eV) lower than the work function of the conductive silicon substrate.

Another aspect of the present invention provides a method of manufacturing a carrier-selective contact junction silicon solar cell, the method including a conductive silicon substrate preparation operation of preparing a conductive silicon substrate including conductive impurities, a passivation layer forming operation of forming a first passivation layer and a second passivation layer on a top surface and a bottom surface of the conductive silicon substrate, respectively, an electron-selective contact layer forming operation of forming an electron-selective contact layer on a bottom surface of the second passivation layer, a hole-selective contact layer forming operation of forming a hole-selective contact layer on a top surface of the first passivation layer, an upper transparent electrode forming operation of forming an upper transparent electrode on a top surface of the hole-selective contact layer, an upper metal electrode forming operation of forming an upper metal electrode on an upper portion of the upper transparent electrode, and a lower metal electrode forming operation of forming a lower metal electrode on a bottom surface of the electron-selective contact layer, wherein in the hole-selective contact layer forming operation, in order to selectively move a hole, a sandwich-structured multilayer film is formed by depositing a copper iodide thin film on a top surface and a bottom surface of an iodine thin film, and a single-film copper iodide thin film is formed by low-temperature annealing the sandwich-structured multilayer film.

In the hole-selective contact layer forming operation, the copper iodide thin film having p-type semiconductor properties may be formed.

In the hole-selective contact layer forming operation, a process atmosphere temperature of the low-temperature annealing may range from 100 to 200° C.

In the hole-selective contact layer forming operation, the single-film copper iodide thin film may have a composition ratio of Cu:I=1:1.

Advantageous Effects

In a carrier-selective contact junction silicon solar cell according to the present invention as described above, p-type semiconductor properties of a hole-selective junction layer can be enhanced by forming a copper iodide thin film using a low-temperature annealing process to prevent iodine vacancy that may occur in an iodination process so that the properties of photoelectric conversion efficiency can be improved.

In addition, according to the present invention, in an iodination process using a low-temperature annealing process, a multilayer film of a sandwich structure is integrated into one single film while an iodine source is injected into upper and lower iodinated thin films so that a manufacturing process can be simplified and a composition ratio of the iodine source can be easily adjusted according to a thickness of an iodine thin film interposed between copper iodide thin films.

DESCRIPTION OF DRAWINGS

FIG. 4 is a table illustrating the atomic percent of the copper iodide thin film according to the embodiment of the present invention.

MODES OF THE INVENTION

Figure 1:
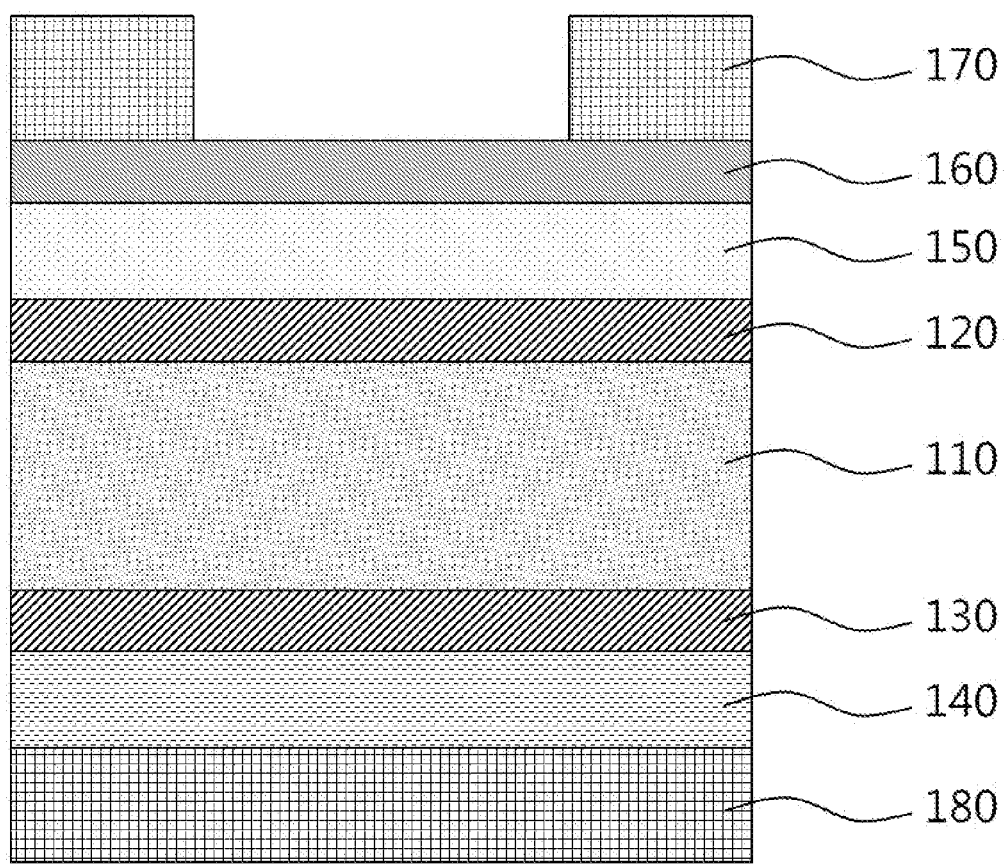
FIG. 1 is a cross-sectional view illustrating a structure of a carrier-selective contact junction silicon solar cell according to an embodiment of the present invention.

Hereinafter, embodiments of the present invention will be described in detail with reference to the accompanying drawings. Like reference numerals illustrated in the drawings denote like elements. In addition, in the following description of the present invention, when it is determined that detailed descriptions of related well-known functions or configurations unnecessarily obscure the gist of the embodiments of the present invention, the detailed descriptions thereof will be omitted. Further, when a part is referred to as "including" a component, this means that the part can include another element and does not exclude another element unless specifically stated otherwise.

Figure 2:
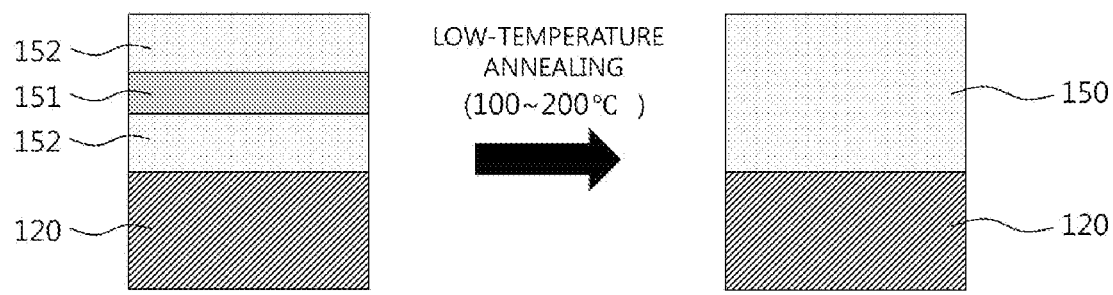
FIG. 2 is a view for describing a process of manufacturing a hole-selective contact layer according to the embodiment of the present invention.

FIG. 1 is a cross-sectional view illustrating a structure of a carrier-selective contact junction silicon solar cell according to an embodiment of the present invention, and FIG. 2 is a view for describing a process of manufacturing a hole-selective contact layer according to the embodiment of the present invention.

A carrier-selective contact junction silicon solar cell 100 according to the embodiment of the present invention may include a conductive silicon substrate 110, passivation layers 120 and 130, an electron-selective contact layer 140, a hole-selective contact layer 150, an upper transparent electrode 160, an upper metal electrode 170, and a lower metal electrode 180.

In the carrier-selective contact junction silicon solar cell 100 according to the embodiment of the present invention, a copper iodide thin film as the hole-selective contact layer 150 is formed through low-temperature annealing to maintain excellent p-type semiconductor properties so that electrical conductivity and passivation properties become excellent, thereby improving photoelectric conversion efficiency.

The conductive silicon substrate 110 may be formed of a semiconductor substrate including a substantially flat top surface and a substantially flat bottom surface that is a surface opposite to the top surface. The conductive silicon substrate 110 may be a crystalline silicon substrate including n-type impurities and may include impurities of a pentavalent element such as phosphorus (P), arsenic (As), antimony (Sb), or the like. The conductive silicon substrate 110 may have a work function, for example, greater than that of the electron-selective contact layer 140 and less than that of the hole-selective contact layer 150, and for example, the work function thereof may satisfy $\Phi \cong 4.2$ eV, but the present invention is not limited thereto.

A top surface of the conductive silicon substrate 110 or the top and bottom surfaces thereof may have a fine texture structure in order to reduce reflectivity and improve light collection efficiency. The texture structure may be formed by wet etching such as acidic etching. In addition, when the top or bottom surface of the conductive silicon substrate 110 is formed in a texture structure, thin films additionally formed on the top or bottom surface may also be formed in a texture structure.

The passivation layers 120 and 130 may be respectively formed on the top and bottom surfaces of the conductive silicon substrate 110 to suppress electron-hole recombination. The passivation layers 120 and 130 may each include an intrinsic amorphous silicon thin film (a-Si:H). Since the intrinsic amorphous silicon thin film has a remarkably small number of electron-hole pairs, the electron-hole recombination may be suppressed so that the generation of heat may be reduced, and the loss of current may be reduced.

The passivation layers 120 and 130 may be formed using a general method such as a chemical vapor deposition (CVD) method, an atmospheric pressure chemical vapor deposition (APCVD) method, a low-pressure chemical vapor deposition (LPCVD) method, a plasma-enhanced chemical vapor deposition (PECVD) method, an atomic layer deposition (ALD) method, a physical vapor deposition (PVD) method, a sputtering method, a high-temperature evaporation deposition method, or the like.

The electron-selective contact layer 140 may be formed on a bottom surface of the passivation layer 130. The electron-selective contact layer 140 may serve as an electron-transfer layer for selectively moving electrons and may be formed of a material having a low work function ($\Phi<3.8$ eV), such as a metal, a metal oxide, an alkali rare earth metal salt, or the like. For example, the electron-selective contact layer 140 may be formed of LiF, KF, CsF, $TiO_2$, $Cs_2CO_3$, or the like, but the present invention is not limited thereto. The electron-selective contact layer 140 may perform a passivation function while selectively moving electrons.

The hole-selective contact layer 150 may be formed on a top surface of the passivation layer 120. The hole-selective contact layer 150 may serve as a hole-transfer layer for selectively moving holes and may be formed of a material having a high work function ($\Phi>5.0$ eV). The hole-selective contact layer 150 may perform a passivation function while selectively moving holes.

The hole-selective contact layer 150 may be formed to have a thickness of about 20 nm. When the hole-selective contact layer 150 has a thickness that is too thick, contact resistance may increase. In addition, when the hole-selective contact layer 150 has a thickness that is too thin, passivation properties may be lowered.

The hole-selective contact layer 150 may be formed of a copper iodide thin film (CuI film) having properties of a p-type semiconductor layer. In order for the copper iodide thin film to maintain excellent p-type semiconductor properties, it is important to reduce the loss of an iodine source ($I_2$) injected into the copper iodide thin film. Preferably, when the copper iodide thin film has a composition ratio of Cu:I=1:1, the excellent p-type semiconductor properties may be maintained.

When the copper iodide thin film having a desired thickness is formed on the top surface of the passivation layer 120 using a thermal vacuum evaporation method, an iodine vacancy may be generated to lower the p-type semiconductor properties. In addition, when the copper iodide thin film is formed using a sputtering process or a rapid thermal process (RTP), the following problem may act as an obstacle. For example, when the iodination process, in which an iodine source ($I_2$) is injected into a copper (Cu) or copper iodide thin film (CuI film) using a sputtering process, is performed, damage is caused to a previously formed thin film. Even when the copper iodide thin film is formed using an RTP, a large amount of iodine source ($I_2$) is volatile into the air to generate an iodine vacancy phenomenon. In addition, the copper iodide thin film may be formed using an ALD method, but the iodine source is highly volatile in a high-temperature environment, and thus the amount of iodine injected during the iodination process becomes insufficient, for example, the copper iodide thin film only has a composition ratio of Cu:I=1.2:0.8, and accordingly, it is difficult to maintain excellent p-type semiconductor properties.

Thus, the embodiment of the present invention provide a method of forming a copper iodide thin film having a desired thickness using a new iodination process in order to suppress the loss of an iodine source, which is injected during an iodination process for forming a copper iodide thin film (CuI film), and to prevent a previously formed thin film from being damaged, and this will be described with reference to FIG. 2.

First, an iodine thin film 151 and copper iodide thin films (CuI film) 152 are deposited on a top surface of the passivation layer 120 to form a multilayer film. The iodine thin film 151 may be formed to have a thickness of 1 to 10 nm, and each of the copper iodide thin films may be formed to have a thickness of 5 to 15 nm. The multilayer film may be formed in a sandwich structure in which the copper iodide thin films 152 are layered on top and bottom surfaces of the iodine thin film 151.

Thereafter, as the hole-selective contact layer 150, a copper iodide thin film, which is integrated into a single film by performing a low temperature annealing process (at 100 to 200° C.), is formed. An iodine source ($I_2$) is diffused into the copper iodide thin films 152 positioned on the top and bottom surfaces of the iodine thin film 151 while the low-temperature annealing process is performed. As the iodine source ($I_2$) is thus diffused into the top and bottom surfaces, and the final copper iodide thin film as the hole-selective contact layer 150 is formed, the composition ratio of the copper iodide thin film may satisfy the ratio of Cu:I=1:1.

By forming the copper iodide thin film through the low-temperature annealing process, excellent p-type semiconductor properties may be maintained so that excellent electrical conductivity may be achieved, and the hole-selective contact layer 150 may be formed to have excellent passivation properties, thereby improving photoelectric conversion efficiency of the solar cell. In addition, the composition ratio of the iodine source may be easily adjusted according to the thickness of the iodine thin film interposed between the thin copper iodide thin films.

EXPERIMENTAL EXAMPLE (Process 1) An n-type silicon substrate having intrinsic amorphous silicon thin films (a-Si:H) deposited on top and bottom surfaces thereof was prepared.

(Process 2) As shown in FIG. 2, a copper iodide thin film 152 was deposited on a top surface of an intrinsic amorphous silicon thin film 120 to a thickness of 15 nm using a thermal vacuum evaporation method.

(Process 3) 0.2 ml of an iodine solution was spin-coated (3000 rpm) on a top surface of the copper iodide thin film 152 to deposit an iodine thin film 151.

(Process 4) A copper iodide thin film 152 was deposited on a top surface of the iodine thin film 151 to a thickness of 15 nm using a thermal vacuum evaporation method.

(Process 5) A low-temperature annealing process (at 190° C.) was performed in vacuum using an RTP method, and thus, as the hole-selective contact layer 150, an integrated copper iodide thin film was formed.

Figure 3:
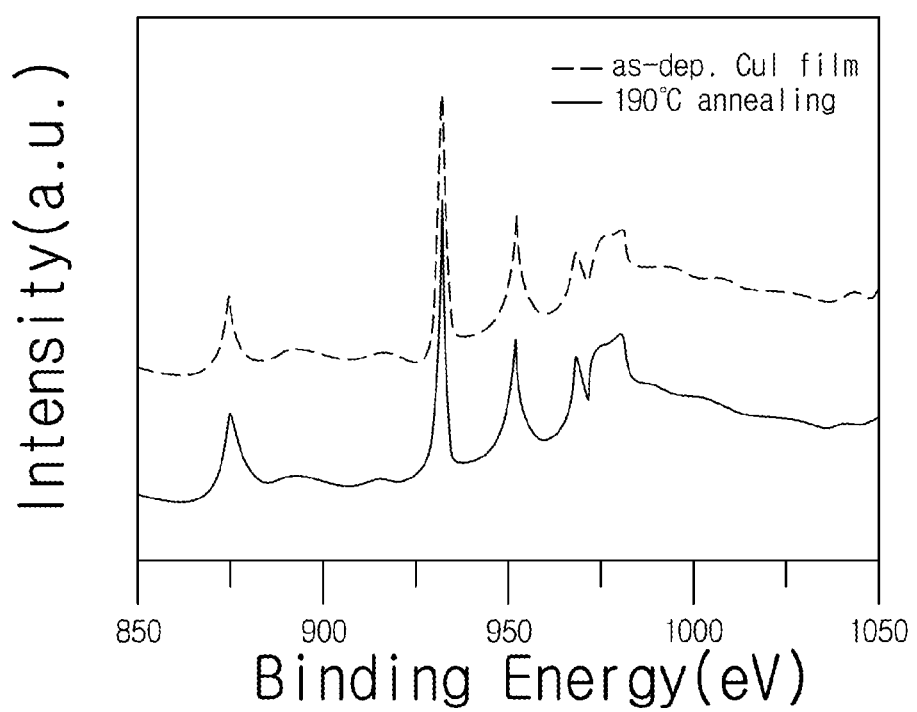
FIG. 3 is a graph illustrating the results of X-ray photoelectron spectroscopy (XPS) analysis of a copper iodide thin film according to the embodiment of the present invention.

A binding energy (eV, dotted line) of a copper iodide thin film (as-dep. CuI film) formed as a single film as in the related art and a binding energy (eV, solid line) of the copper iodide thin film (annealing at 190° C.) that is integrated by low-temperature annealing a sandwich-structured multilayer film according to the present invention have similar types as shown FIG. 3 based on the result of XPS analysis on the copper iodide thin film formed in [Experimental Example].

Referring to FIG. 4, iodine (I3d5) of the copper iodide thin film (as-dep. CuI film) formed as a single layer in the related art has an atomic percent of 44.96% and a composition ratio of Cu:I=1.11:1, and iodine (I3d5) of the copper iodide thin film (annealing at 190° C.) that is integrated by low-temperature annealing a sandwich-structured multilayer film according to the present invention has an atomic percent of 46.16% and a composition ratio of Cu:I=1.03:1. It may be confirmed that the composition ratio of the copper iodide thin film according to the present invention is very close to Cu:I=1:1.

Thus, it may be confirmed that the amount of the iodine source injected into the integrated copper iodide thin film according to the present invention is increased as compared to the related art.

Further, it may be confirmed that a surface resistance Rsheet (kΩ/sq; □) of the copper iodide thin film that is integrated by low-temperature annealing a sandwich-structured multilayer film according to the present invention is lowered than a surface resistance of the copper iodide thin film formed as a single film in the related art. When the surface resistance is lowered, electrical conductivity is increased.

Figure 5:
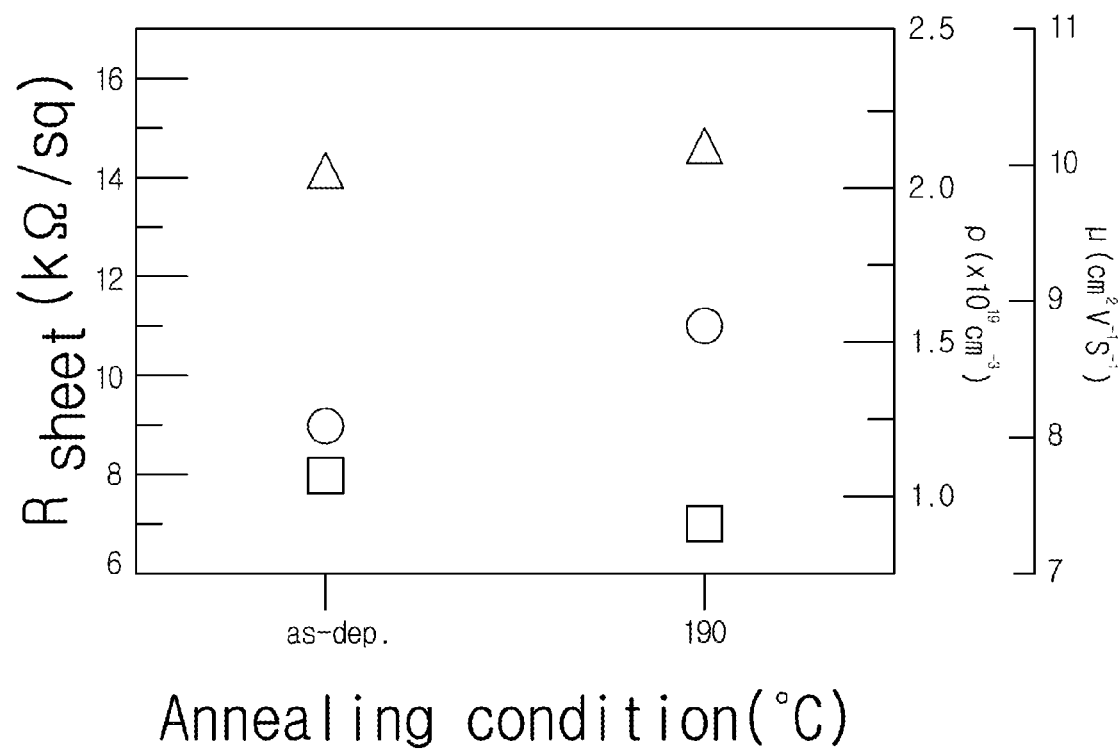
FIG. 5 is a graph illustrating electrical characteristics of the copper iodide thin film according to the embodiment of the present invention.

As shown in FIG. 5, the surface resistance is related to a hole density and an electron mobility. It may be confirmed that the hole density $\rho(\times 10^{19}\ cm^{-3}; \Delta)$ of the copper iodide thin film integrated by low-temperature annealing a sandwich-structured multilayer film according to the present invention is increased slightly more than a hole density of the copper iodide thin film formed as a single film in the related art, and the electron mobility $\mu\ (cm^2V^{-1}S^{-1}; o)$ of the copper iodide thin film integrated by low-temperature annealing a sandwich-structured multilayer film according to the present invention is increased more than an electron mobility of the copper iodide thin film formed as a single film in the related art.

According to [Experimental Example], it may be confirmed that as the hole density and electron mobility of the copper iodide thin film integrated by low-temperature annealing a sandwich-structured multilayer film are increased as compared with the copper iodide thin film formed as a single film in the related art, the sheet resistance is lowered and thus p-type semiconductor properties are enhanced.

An upper transparent electrode 160 may be formed on a top surface of a hole-selective contact layer 150. The upper transparent electrode 160 may perform a role of an electrode while performing a role of preventing reflection. The upper transparent electrode 160 may be formed of, for example, an indium tin oxide (ITO) thin film or a doped ZnO thin film, but the present invention is not limited thereto.

An upper metal electrode 170 may be formed on the upper transparent electrode 160. The upper metal electrode 170 may be formed in a grid form. For example, the upper metal electrode 170 may be formed of gold, silver, copper, aluminum, nickel, or palladium alone or as an alloy, but the present invention is not limited thereto.

A lower metal electrode 180 may be formed on a bottom surface of an electron-selective contact layer 140. For example, the lower metal electrode 180 may be formed of gold, silver, copper, aluminum, nickel, or palladium alone or as an alloy, but the present invention is not limited thereto.

Figure 6:
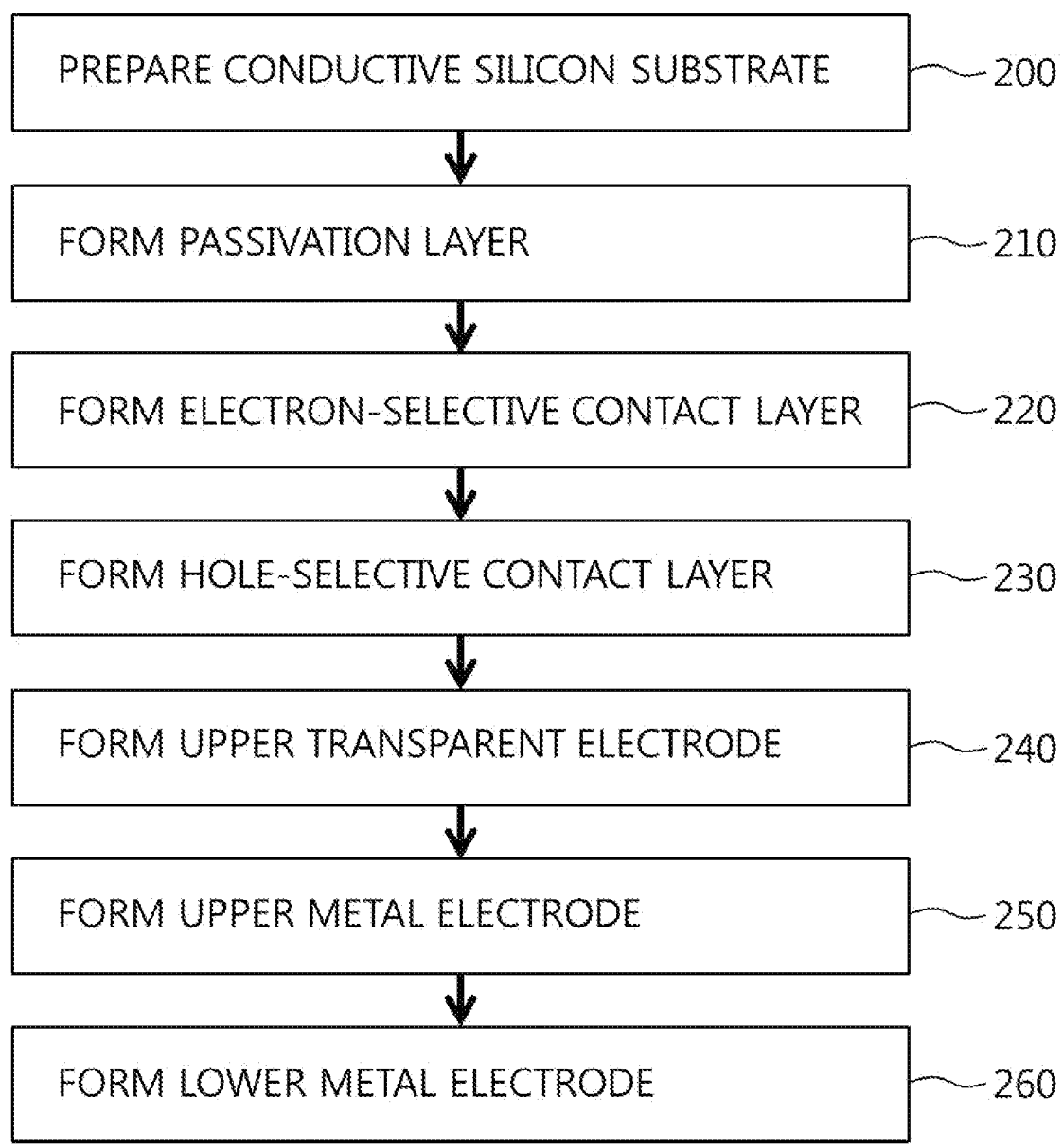
FIG. 6 is a flowchart illustrating a method of manufacturing the carrier-selective contact junction silicon solar cell according to the embodiment of the present invention.

Referring to FIG. 6, a method of manufacturing the carrier-selective contact junction silicon solar cell according to the embodiment of the present invention may include preparing a conductive silicon substrate (200), forming a passivation layer (210), forming an electron-selective contact layer (220), forming a hole-selective contact layer (230), forming an upper transparent electrode (240), forming an upper metal electrode (250), and forming a lower metal electrode (260).

Meanwhile, the method of manufacturing the carrier-selective contact junction silicon solar cell may include an additional process of forming each thin film or layer.

In a carrier-selective contact junction silicon solar cell 100 manufactured by the method of manufacturing the carrier-selective contact junction silicon solar cell, a passivation layer 120, a hole-selective contact layer 150, an upper transparent electrode 160, and an upper metal electrode 170 may be sequentially formed on an upper portion of a conductive silicon substrate 110, and a passivation layer 130, an electron-selective contact layer 140, and a lower metal electrode 180 may be sequentially formed on a lower portion of the conductive silicon substrate 110. In the carrier-selective contact junction silicon solar cell 100, a copper iodide thin film as the hole-selective contact layer 150 is formed through low-temperature annealing to maintain excellent p-type semiconductor properties so that electrical conductivity and passivation properties become excellent, thereby improving photoelectric conversion efficiency.

The preparing of the conductive silicon substrate (200) is an operation of preparing the conductive silicon substrate 110 including conductive impurities. The conductive silicon substrate 110 may be a crystalline silicon substrate including n-type impurities and may include impurities of a pentavalent element such as phosphorus (P), arsenic (As), antimony (Sb), or the like. The conductive silicon substrate 110 may have a work function, for example, greater than that of the electron-selective contact layer 140 and less than that of the hole-selective contact layer 150, and for example, the work function thereof may satisfy $\Phi \cong 4.2$ eV, but the present invention is not limited thereto.

A top surface of the conductive silicon substrate 110 or the top and bottom surfaces thereof may be formed in a fine texture structure in order to reduce reflectivity and improve light collection efficiency. The texture structure may be formed by wet etching such as acidic etching. In addition, when the top or bottom surface of the conductive silicon substrate 110 is formed in a texture structure, thin films additionally formed on the top or bottom surface may also be formed in a texture structure.

The forming of the passivation layer (210) is an operation of forming the passivation layers 120 and 130 on the top and bottom surfaces of the conductive silicon substrate 110. The passivation layers 120 and 130 may each include an intrinsic amorphous silicon thin film (a-Si:H). Since the intrinsic amorphous silicon thin film has a remarkably small number of electron-hole pairs, the electron-hole recombination may be suppressed so that the generation of heat may be reduced, and the loss of current may be reduced.

The passivation layers 120 and 130 may be formed using a general method such as a CVD method, an APCVD method, an LPCVD method, a PECVD method, an ALD method, a PVD method, a sputtering method, a high temperature evaporation deposition method, or the like.

The forming of the electron-selective contact layer (220) is an operation of forming the electron-selective contact layer 140 on a bottom surface of the passivation layer 130. The electron-selective contact layer 140 may serve as an electron-transfer layer for selectively moving electrons and may be formed of a material having a low work function ($\Phi$<3.8 eV), such as a metal, a metal oxide, an alkali rare earth metal salt, or the like. For example, the electron-selective contact layer 140 may be formed of LiF, KF, CsF, TiO$_2$, Cs$_2$CO$_3$, or the like, but the present invention is not limited thereto. The electron-selective contact layer 140 may perform a passivation function while selectively moving electrons.

The forming of the hole-selective contact layer (230) is an operation of forming the hole-selective contact layer 150 on a top surface of the passivation layer 120. The hole-selective contact layer 150 may be formed of a material having a high work function (Φ>5.0 eV). The hole-selective contact layer 150 may perform a passivation function while selectively moving holes.

The hole-selective contact layer 150 may be formed to have a thickness of 20 nm. When the hole-selective contact layer 150 has a thickness that is too thick, contact resistance may increase. In addition, when the hole-selective contact layer 150 has a thickness that is too thin, passivation properties may be lowered.

The hole-selective contact layer 150 may be formed of a copper iodide thin film (CuI film) having properties of a p-type semiconductor layer. In order for the copper iodide thin film to maintain excellent p-type semiconductor properties, it is important to reduce the loss of an iodine source (I$_2$) injected into the copper iodide thin film. Preferably, when the copper iodide thin film has a composition ratio of Cu:I=1:1, the excellent p-type semiconductor properties may be maintained.

The embodiment of the present invention provides a new iodination process in order to suppress the loss of an iodine source, which is injected during an iodination process for forming a copper iodide thin film (CuI film), and prevent a previously formed thin film from being damaged.

First, an iodine thin film 151 and copper iodide thin films (CuI film) 152 are deposited on a top surface of the passivation layer 120 to form a multilayer film. The multilayer film may be formed in a sandwich structure in which the copper iodide thin films 152 are layered on top and bottom surfaces of the iodine thin film 151. The iodine thin film 151 may be formed to have a thickness of 1 to 10 nm, and each of the copper iodide thin films may be formed to have a thickness of 5 to 15 nm.

Thereafter, as the hole-selective contact layer 150, a copper iodide thin film, which is integrated into a single film by performing a low temperature annealing process (at 100 to 200° C.), is formed. An iodine source (I$_2$) is diffused into the copper iodide thin films 152 positioned on the top and bottom surfaces of the iodine thin film 151 while the low-temperature annealing process is performed. As the iodine source (I$_2$) is thus diffused into the top and bottom surfaces, and the final copper iodide thin film as the hole-selective contact layer 150 is formed, the composition ratio of copper and iodine may be adjusted to 1:1.

By forming the copper iodide thin film through the low-temperature annealing process, excellent p-type semiconductor properties may be maintained so that excellent electrical conductivity may be achieved, and it is possible to use the hole-selective contact layer 150 having excellent passivation properties, thereby improving photoelectric conversion efficiency of the solar cell. In addition, the composition ratio of the iodine source may be easily adjusted according to the thickness of the iodine thin film interposed between the thin copper iodide thin films.

The forming of the upper transparent electrode (240) is an operation of forming the upper transparent electrode 160 on a top surface of the hole-selective contact layer 150. The upper transparent electrode 160 may perform a role of an electrode while performing a role of preventing reflection. The upper transparent electrode 160 may be formed of, for example, an indium tin oxide (ITO) thin film or a doped ZnO thin film, but the present invention is not limited thereto.

The forming of the upper metal electrode (250) is an operation of forming the upper metal electrode 170 on an upper portion of the upper transparent electrode 160. The upper metal electrode 170 may be formed in a grid form. For example, the upper metal electrode 170 may be formed of gold, silver, copper, aluminum, nickel, or palladium alone or as an alloy, but the present invention is not limited thereto.

The forming of the lower metal electrode (260) is an operation of forming the lower metal electrode 180 on a bottom surface of the electron-selective contact layer 140. For example, the lower metal electrode 180 may be formed of gold, silver, copper, aluminum, nickel, or palladium alone or as an alloy, but the present invention is not limited thereto.

The above description of the invention is only exemplary, and it will be understood by those skilled in the art that various modifications can be made without departing from the scope of the present invention and without changing essential features.

Therefore, the above-described embodiments should be considered in a descriptive sense only and not for purposes of limitation. For example, components described as a single form may be executed while being distributed, and similarly, components described as being distributed may be executed as being combined.

The scope of the present invention is defined not by the detailed description but by the appended claims and encompasses all modifications and alterations derived from meanings and the scope and equivalents of the appended claims.

What is claimed is:

1. A method of manufacturing a carrier-selective contact junction silicon solar cell, the method comprising:
    a conductive silicon substrate preparation operation of preparing a conductive silicon substrate including conductive impurities;
    a passivation layer forming operation of forming a first passivation layer and a second passivation layer on a top surface and a bottom surface of the conductive silicon substrate, respectively;
    an electron-selective contact layer forming operation of forming an electron-selective contact layer on a bottom surface of the second passivation layer;
    a hole-selective contact layer forming operation of forming a hole-selective contact layer on a top surface of the first passivation layer;
    an upper transparent electrode forming operation of forming an upper transparent electrode on a top surface of the hole-selective contact layer;
    an upper metal electrode forming operation of forming an upper metal electrode on an upper portion of the upper transparent electrode; and
    a lower metal electrode forming operation of forming a lower metal electrode on a bottom surface of the electron-selective contact layer,
    wherein in the hole-selective contact layer forming operation, in order to selectively move a hole, a sandwich-structured multilayer film is formed by depositing a copper iodide thin film on a top surface and a bottom surface of an iodine thin film, and a single-film copper iodide thin film is formed by low-temperature annealing the sandwich-structured multilayer film.

2. The method of claim 1, wherein in the hole-selective contact layer forming operation, the copper iodide thin film having p-type semiconductor properties is formed.

3. The method of claim 1, wherein in the hole-selective contact layer forming operation, a process atmosphere temperature of the low-temperature annealing ranges from 100 to 200° C.

4. The method of claim 1, wherein in the hole-selective contact layer forming operation, the single-film copper iodide thin film has a composition ratio of Cu:I=1:1.

* * * * *